United States Patent
Chen et al.

(10) Patent No.: US 6,172,565 B1
(45) Date of Patent: Jan. 9, 2001

(54) ADAPTIVE JOINT LINEARIZATION, EQUALIZATION AND DELAY ALIGNMENT FOR A WIDEBAND POWER AMPLIFIER

(75) Inventors: Jiunn-Tsair Chen, New Brunswick; Young-Kai Chen, Berkeley Heights; Huan-Shang Tsai, Parsippany, all of NJ (US)

(73) Assignee: Lucent Technologies Inc., Murray Hill, NJ (US)

(*) Notice: Under 35 U.S.C. 154(b), the term of this patent shall be extended for 0 days.

(21) Appl. No.: 09/041,604

(22) Filed: Mar. 13, 1998

(51) Int. Cl.$^7$ ...................................................... H03F 1/26
(52) U.S. Cl. ........................................... 330/151; 330/149
(58) Field of Search ...................................... 330/149, 151

(56) References Cited

U.S. PATENT DOCUMENTS

| | | | |
|---|---|---|---|
| 5,049,832 | 9/1991 | Cavers | 330/149 |
| 5,157,345 | * 10/1992 | Kenington et al. | 330/151 |
| 5,489,875 | 2/1996 | Cavers | 330/151 |
| 5,515,000 | * 5/1996 | Maruyama et al. | 330/151 |

FOREIGN PATENT DOCUMENTS

675594A1   1/1995   (EP).
729228A1   8/1996   (EP).

OTHER PUBLICATIONS

Cavers, J.K. "Adaption behavior of a feedforward amplifier linearizer," *IEEE Trans. on Veh. Tech.*, Feb. 1995, vol. 44, No. 1, pp. 31–40.

Grant, S.J., et al., "A DSP controlled adaptive feedforward amplifier linearizer," *5th International Conference on Universal Personal Communications*, Cambridge. MA, 1996, vol. 2, pp. 788–792.

European Search Report for Application No. 99301791 dated Jun. 30, 1999.

* cited by examiner

Primary Examiner—Michael B Shingleton

(57) ABSTRACT

A feedforward linearizer includes a signal cancellation circuit and an error cancellation circuit. The signal cancellation circuit includes a tap delay line, that delay the input signal by a predetermined time delay so as to provide several delayed versions of the input signal. Each delayed version of the input signal is weighted by a tap coefficient. The weighted signals are then added together and fed to the power amplifier. The tap coefficients are derived such that the signals traveling through the upper and lower branch of the signal cancellation loop are aligned and that the output signal of the power amplifier is equalized.

24 Claims, 4 Drawing Sheets

ADAPTIVE JOINT LINEARIZATION, EQUALIZATION AND DELAY ALIGNMENT FOR A WIDEBAND POWER AMPLIFIER

FIELD OF THE INVENTION

This invention relates to a wideband power amplifier and specifically to an amplifier having a feed-forward linearizer arrangement employing digital signal processing techniques for performing joint linearization, equalization and delay alignment.

BACKGROUND OF THE INVENTION

In many radio frequency, RF, applications power amplifiers are employed to amplify high frequency signals. Because the RF amplifiers are biased to provide substantially high output power, they exhibit nonlinear responses to some degree. Consequently, in response to an increase in the output signal power, such RF amplifiers generate intermodulation IM components, which may have frequencies that are outside a desired frequency band.

One solution to eliminate the consequences of the non-linear response of the amplifier is to employ multiple amplifiers each configured to amplify a predetermined carrier signal. For example, in a mobile communications environment, the base station sends multiple carrier signals in accordance with time division multiple access (TDMA) scheme, or in accordance with code division multiple access (CDMA) scheme. Each carrier frequency in TDMA scheme corresponds to one of the users in a specifiable cell. Furthermore, each pseudocode in CDMA scheme corresponds to one of the users in a specifiable cell. Because the base station has to communicate with many users in the corresponding cell, the intermodulation IM components increase with the number of the users. Thus, the use of a separate amplifier for each carrier signal substantially eliminates the generation of intermodulation IM components. However, this approach is costly and may not be commercially feasible in many applications.

Another approach is to employ an analog linearizer, such as 10 as illustrated in FIG. 1. For purposes of illustrating the operation of linearizer 10, it is assumed that a two-tone signal is provided to the linearizer. Basically, a radio frequency signal represented by frequency components 22 is fed to a power amplifier 12. Amplifier 12 generates additional intermodulation IM frequency components 24 because of its nonlinear response characteristics. Signal components 22' correspond to an amplified version of signal components 22. The function of linearizer 10 is to substantially eliminate frequency components 24, as explained in more detail below.

Linearizer 10 includes a signal cancellation circuit 26 coupled to an error cancellation circuit 28. Signal cancellation circuit 26 has an upper branch that includes power amplifier 12, and a lower branch that provides the input signal of the linearizer to an input port of an adder 16 via a delay element 15. The other input port of adder 16 is configured to receive the output signal generated by power amplifier 12, via an attenuator 14. As a result, the output port of adder 16 provides signal components 24', which correspond to the attenuated version of intermodulation IM frequency components 24. The purpose of delay element 15 is to assure that the input signal provided to adder 16 through the lower branch is aligned with the input signal provided through the upper branch.

Error cancellation circuit 28 also includes an upper branch that is configured to provide the output signal generated by amplifier 12 to an adder 20 via a delay element 17. The lower branch of error cancellation circuit 28 includes an amplifier 18, which is configured to receive the attenuated intermodulation components 24'. Amplifier 18 generates an amplified version of signal 24' which is substantially equal to intermodulation component 24. As a result, the output port of adder 20 provides signal components 22' without the distortion caused by amplifier. The purpose of delay element 17 is to assure that the signal provided through the lower branch is aligned with the direct signal provided in the upper branch.

The feedforward linearizer described in FIG. 1 has some disadvantages. For example, it is not able to adapt to signal changes. Furthermore, for wide-band input signals in the microwave frequency range, adjusting the delay in delay elements 15 and 17 is difficult. A small delay misalignment may lead to serious signal distortion. In order to provide a delay alignment between the upper and lower branches of the two cancellation circuits, some linearizers have been suggested that attempt to align the signal by trial and error during the operation. These linearizers employ a delay adjuster to achieve the intended delay alignment. However, the trial and error approach provides only limited accuracy and may lead to unacceptable output signal response.

For signals or the microwave frequency range, the bandwidth accommodated by power amplifier 12 is relatively small. Amplifiers that accommodate a large bandwidth are expensive. Thus, equalization for the power amplifier is required to increase the operating bandwidth so that the frequency response of the power amplifier is substantially flat. The prior art feedforward linearizers direct all the linear distortion caused by delay misalignment and the non-linear distortions caused by of the power amplifier to the auxiliary amplifier in the error cancellation loop. The auxiliary amplifier is designed as a class A amplifier. The distortion generated by the auxiliary amplifier itself is not recoverable. Thus, a high-accuracy class A amplifier that handles high power input is required in the error cancellation loop, which is expensive and difficult to design.

Thus, there is a need for a feedforward linearizer that employs an effective digital signal processing technique that provides delay alignment and equalization to suppress intermodulation components, by an arrangement that is both effective and economical.

SUMMARY OF THE INVENTION

In accordance with one embodiment of the invention, a feedforward linearizer includes a signal cancellation circuit and an error cancellation circuit. The signal cancellation circuit includes a tap delay line, that delay the input signal by a predetermined time delay so as to provide several delayed versions of the input signal. Each delayed version of the input signal is weighted by a tap coefficient. The weighted signals are then added together and fed to the power amplifier. The tap coefficients are derived such that the signals traveling through the upper and lower branch of the signal cancellation loop are aligned and that the output signal of the power amplifier is equalized.

The error cancellation circuit also includes a tap delay line, that delays the error signal to the error cancellation circuit by a predetermined time delay so as to provide several delayed versions of the error cancellation input signal. Each delayed version of the error cancellation input signal is weighted by a tap coefficient. The weighted signals are then added together and fed to an auxiliary amplifier. The tap coefficients in the error cancellation circuit are derived such that the signals traveling through the upper and lower branch of the error cancellation circuit are aligned.

In accordance with one embodiment of the invention, the tap coefficients are derived such that substantially no equalization for the auxiliary amplifier is achieved.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE DRAWINGS

Figure 1:
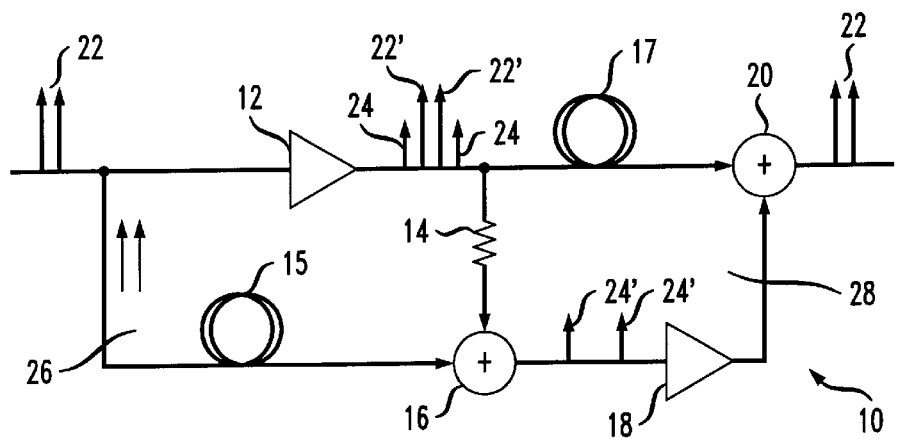
FIG. 1 illustrates a prior art analog feedforward linearizer.
Figure 2A:
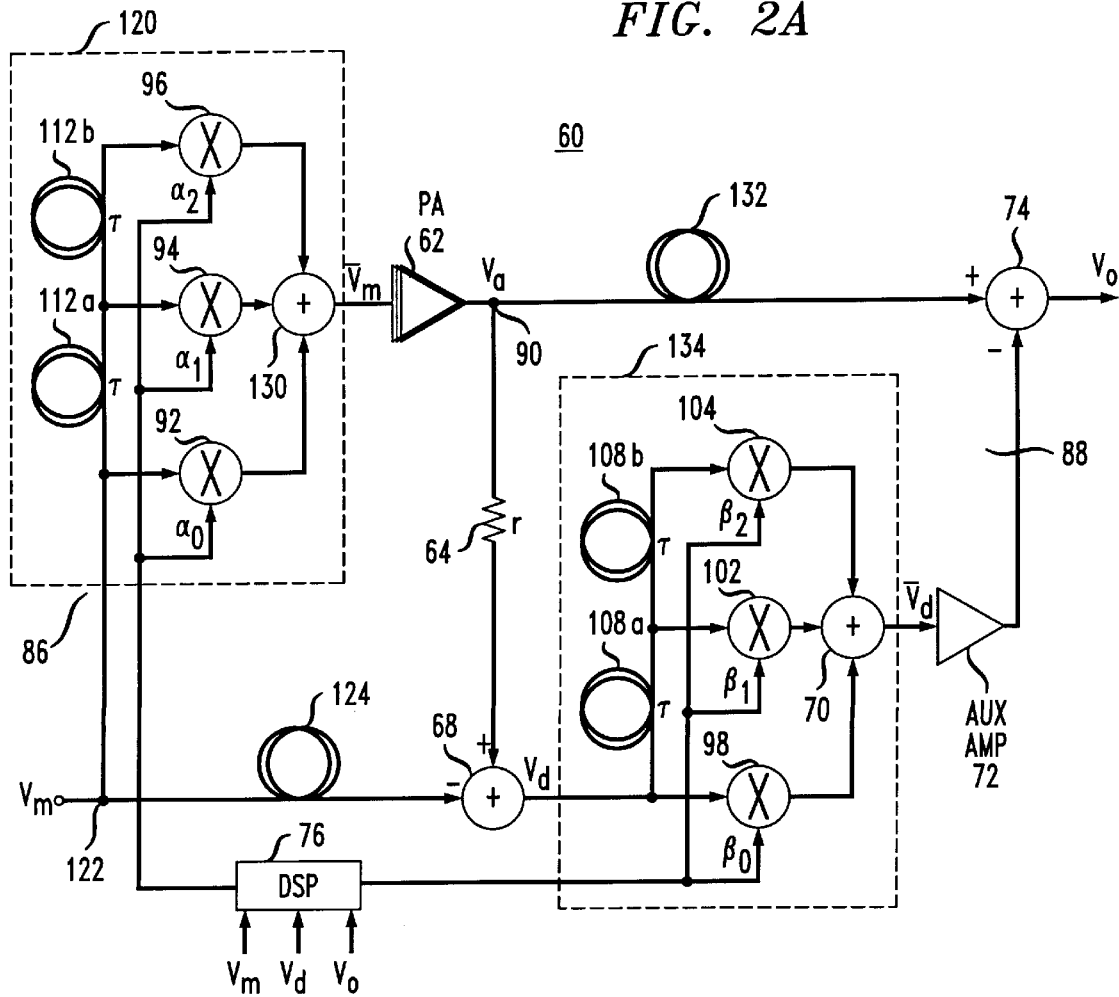
FIG. 2a illustrates a feedforward linearizer in accordance with one embodiment of the invention.

FIG. 2a illustrates a wideband power amplifier feedforward linearizer 60 in accordance with one embodiment of the invention, although the invention is not limited in scope in that respect.

Linearizer 60 includes a signal cancellation circuit or loop 86 and an error cancellation loop or circuit 88. Each of the cancellation circuits 86 and 88 have two branches. Thus, signal cancellation circuit 86 includes a first signal cancellation branch that contains an amplifier 62, which is configured to receive an input signal $V_m$, via a tap delay circuit 120. Input signal $V_m$ is also diverted to a second signal cancellation branch via signal splitter 122 and a delay element 124.

The output port of power amplifier 62 provides an output signal $V_u$ and is coupled to an attenuator 64 having an attenuation factor r, via a splitter 90. The output port of attenuator 64 is coupled to an adder 68. The other input port of adder 68 is configured to receive the input signal $V_m$, via delay element 124 in the second signal cancellation branch. The output port of adder 68 provides an error signal $V_d$ to error cancellation circuit 88.

As stated before, in the background of the invention, a small delay mismatch between the time that signal $V_m$ is provided to adder 68 through the first and second branch of the signal cancellation loop can cause substantial degradation in the performance of the linearizer. To this end, tap delay circuit 120 is employed to provide delay alignment and equalization in accordance with one embodiment of the invention.

Delay circuit 120 includes a plurality of tap delay elements 112 that are configured to provide a predetermined delay τ to signal $V_m$. Thus, an input port of tap delay element 112a is configured to receive input signal $V_m$. An output port of tap delay element 112a is coupled to an input port of the following tap delay element 112b, and so forth. As will be explained in more detail later, the number of tap delay elements depends, among other things, on the delay mismatch $\tau_\alpha$, which is the delay difference between the upper and lower branches of the signal cancellation circuit.

Delay circuit 120 also includes a plurality of multipliers, such as 92, 94 and 96, which are configured to receive signal $V_m$, a first delayed version of input signal $V_m$ after it has been delayed by delay element 112a, and a second delayed version of input signal $V_m$ after it has been delayed by delay element 112b, and so forth. Each multiplier is configured to receive tap coefficients $\alpha_i$, wherein i is the index relating to the number of the tap delay element that provides a delayed version of $V_m$ to the multiplier. An output port of multipliers 92, 94 and 96 is coupled to an adder 130. The output port of adder 130 is in turn coupled to an input port of power amplifier 72.

The output port of power amplifier 62 is also coupled to a first error cancellation branch of linearizer 60 via signal splitter 90. The first error cancellation branch includes a delay element 132 and an error cancellation adder 74 adapted to receive a delayed version of signal $V_u$ at one of its input ports. The second error cancellation branch of linearizer 60 includes a tap delay circuit 134 that is configured to receive the error signal $V_d$ at its input port. The output port of tap delay circuit 134 is coupled to an input port of an auxiliary amplifier 72. The output port of auxiliary amplifier 72 is coupled to the other input port of adder 74. In accordance with one embodiment of the invention, the output port of adder 74 provides the output signal of linearizer 60.

Delay circuit 134 also includes a plurality of multipliers, such as 98, 102 and 104, which are configured to receive the error signal $V_d$, a first delayed version of input signal $V_d$ after it has been delayed by delay element 108a, and a second delayed version of input signal $V_d$ after it has been delayed by delay element 108b. Each multiplier is configured to receive a tap coefficient $\beta_i$, wherein i is the index relating to the number of the tap delay element that provides a delayed version of $V_d$ to the multiplier. An output port of multipliers 98, 102 and 104 is coupled to an adder 70. The output port of adder 70 is in turn coupled to the input port of auxiliary amplifier 72.

Figure 2B:
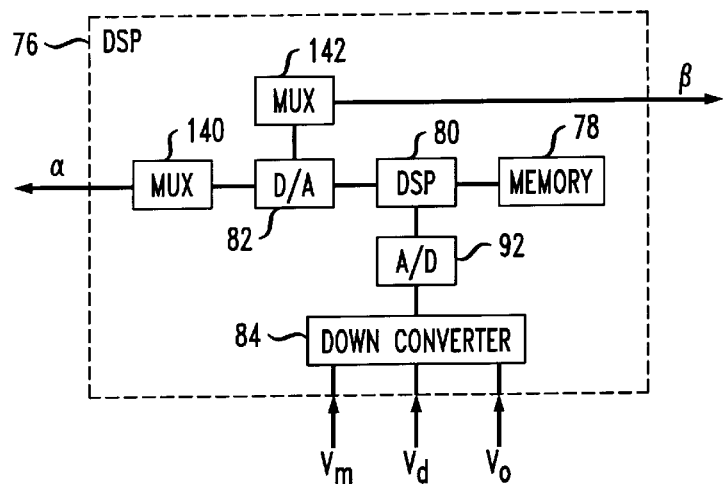

A digital signal processor 76 is configured to receive input signal, $V_m$, error signal, $V_d$, and the output signal $V_o$. The digital signal processor as illustrated in FIG. 2b, in accordance with one embodiment of the invention, includes a down converter circuit 84, which is configured to shift the frequency range of signals, $V_m$, $V_d$, and $V_o$ into the baseband frequency range, although the invention is not limited in scope in that respect. For example, a separate down converter circuit, in accordance with another embodiment of the invention, first shifts the frequencies to the baseband range, and then provides the down converted signal to digital signal processor 76.

The output port of down converter circuit 84 is coupled to a digital signal processing circuit 80, via an analog-to-digital converter 92. Signal processing circuit 80 is configured to perform the necessary calculations to generate tap coefficients $\alpha_i$ and $\beta_i$ and provide them respectively via multiplexers 140 and 142 to tap delay circuits 120 and 134.

As will be explained in more detail hereinafter, the arrangement of tap delay circuit 120 provides for a delay alignment and equalization at the same time in the signal cancellation circuit. Furthermore, the arrangement of tap delay circuit 134 provides for a delay alignment in the error cancellation circuit.

The output signal of adder 130 can be written as $$\overline{V_m}(kT) = \sum_{i=0}^{L} \alpha_i V_m(kT - i\tau), \quad (1)$$

wherein L is the number of tap delay elements 112, $\alpha_i$ are tap coefficients, 1/T is the sampling rate determined by the capabilities of digital signal processor 76, $\tau$ is the tap delay for each tap delay element 112. In accordance with one embodiment of the invention the tap delay is chosen to be inversely proportional to the input signal bandwidth to achieve equalization. It is noted that for wideband input signals $V_m$, T is substantially larger than $\tau$. Thus, in accordance with one embodiment of the invention, digital signal processor 76 receives L+1 samples of $V_m$ at times t=kT−i$\tau$, wherein i=0, 1, . . . , L at each sampling. Digital signal processing circuit 80 employs a least mean square (LMS) algorithm to calculate the tap coefficients $\alpha_i$ based on the following recursive equation:

$$\alpha_i(k+1) = \alpha_i(k) - \mu_\alpha V_d(kT) V^*_m(kT - i\tau), \quad i=0, 1, \ldots L, \quad (2)$$

where $\mu_\alpha$ is the step size for the algorithm, and $V^*_m$ is the complex conjugate of input signal $V_m$. It is noted that coefficients $\alpha_i$ are derived such that error signal $V_d(kT)$ has substantially no correlation with input signal and its delayed versions, $V_m(kT-i\tau)$ for I=0, 1, . . . , L. As will be explained in more detail hereinafter, the solution to equation (2) in accordance with a least mean square algorithm provides both delay alignment and equalization at the same time.

Thus, the converged solution $\alpha_i$ to equation (2) may be deconvolved to two components, the first referred to as $\alpha_{d,i}$, and the second referred to as components $\alpha_{e,i}$, wherein $\alpha_{d,i}$ are the desired tap coefficients when power amplifier 62 requires no equalization, and components $\alpha_{e,i}$ are the desired tap coefficients when there is no delay misalignment between the two branches of signal cancellation circuit 86. It is also assumed that the delay difference between the two branches is $\tau_\alpha$ when delay alignment is required.

Therefore, the intent is to adjust the tap coefficients $\alpha_{d,i}$, to introduce a delay $\tau_\alpha$, in a branch, other than the one that is generating an extra delay $\tau_\alpha$, which compensates for the existing delay between the two branches. Therefore, it is desired that the impulse response of the delay tap element to be $\delta(t+\tau_\alpha)$, where $\delta(.)$ is an impulse function. The frequency response of $\delta(t+\tau_\alpha)$ is $e^{-j2\pi f\tau_\alpha}$, where $f$ denotes the frequency. Since all the signals under consideration are band-limited signals, the frequency response may be truncated by a window without affecting the performance of the tap delay line. The truncated frequency response can be written as $e^{-j2\pi f\tau_\alpha} \Pi(f/f_c)$, wherein $f_c$ is the bandwidth of the signals and $\Pi(.)$ Is a rectangular box function, defined as $\Pi(x)=1$ if $|x|<\frac{1}{2}$ and $\Pi(x)=0$ otherwise. The inverse Fourier transform of $\Pi(f/f_c)$ equals to $(1/\tau)$ Sinc $(t/\tau)$, wherein $\tau$ is defined as $\tau=1/f_c$, which is the tap delay amount in each tap delay element 112, and sinc $(x)=(\sin \pi x)/\pi x$. Therefore, the inverse Fourier transform of $e^{-j2\pi f\tau_\alpha}\Pi(f/f_c)$, equals to $(1/\tau)$ Sinc $((t+\tau_\alpha)/\tau)$, which is proportional to Sinc $(i+\tau_\alpha/\tau)$ after sampling. Thus, assuming that power amplifier 62 does not require equalization, the optimal tap coefficients for a delay alignment are given by $$\alpha_{d,i} = \text{Sinc } (i+\tau_\alpha/\tau), \quad i=-\infty, \ldots \infty, \quad (3)$$

wherein $\tau_\alpha$ is the delay difference between the upper and lower branches of the signal cancellation circuit. The optimal tap coefficients $\alpha_{e,i}$ for equalization with no delay misalignment, is determined by the characteristics and operating range of power amplifier 62. The overall tap coefficients for delay circuit 120 is obtained as the convolution of $\alpha_{d,i}$ and $\alpha_{e,i}$.

The number of tap delay elements 112 among other things depends on the ratio of $\tau_\alpha/\tau$. Thus if this ratio is close to an integer, $\alpha_{d,i}$ will quickly converge to zero as $|i|$ increases. Thus, $\alpha_i$ may be truncated by a small window and use only a small number of taps.

The solution for error cancellation circuit 88 is described hereinafter. The signal $V_d$ provided by tap delay circuit 134 in error cancellation circuit 88 can be written as $$\overline{V_d}(kT) = \sum_{i=0}^{M} \beta_i V_d(kT - i\tau), \quad (4)$$

where M delay elements 108 are employed in the tap delay circuit and $\beta_i$ is the corresponding tap coefficient, associated with each delay element 108. At each sampling, M+1 samples of $V_d$ are taken at t=kT−i$\tau$, i=0, 1, . . . , M.

In accordance with one embodiment of the invention, as explained above in reference with the signal cancellation loop, digital signal processor derives tap coefficients $\beta_i$ such that the error signal $V_d$ (kT) remains uncorrelated to the input signal $V_m$ (kT). In order to make the output signal $V_o$ (kT) of linearizer 60 fully correlated to input signal $V_m$ (kT), digital signal processor 76 controls the tap coefficients $\beta_i$ in the error cancellation circuit 88 such that the output signal $V_o$ (kT) is substantially uncorrelated with the error signal $V_d$ (kT). To accomplish this purpose a conventional least mean square algorithm for the error cancellation circuit 88 will cause output signal $V_o$ (kT) to be uncorrelated with not only $V_d$ (kT), but also to each error sample $V_d$ (kT), $V_d$ (kT+$\tau$), . . . , $V_d$ (kT+M$\tau$). However, this solution may not be acceptable for some design specifications, because not only the error signal is substantially canceled, but some of the undistorted signal will be canceled also. It is noted that the least mean square algorithm employed for the signal cancellation loop also causes the error signal $V_d$ (kT) to become uncorrelated to $V_m$(kT−i$\tau$) for i=0, 1, . . . , L. However, this solution does not degrade the performance of linearizer 60.

In order to make $V_o$(kT) only uncorrelated to $V_d$(kT) and still align the delay misalignment between the upper and lower branches of the error cancellation circuit, digital signal processor 76 employs a constrained version of a least mean square algorithm in accordance with one embodiment of the invention, although the invention is not limited in scope in this aspect. Thus, the least mean square algorithm employs a constraint such that the tap coefficients $\beta_i$ can only be updated within the subset where $\beta_i$ takes the form as $$\beta_i = c\,\text{sinc}\left(i + \frac{t}{\tau}\right) \quad i = 0, 1, \ldots, M, \quad (5)$$

where the variable t represents the delay adjustment and c is a complex variable. Thus, in accordance with one embodiment of the invention, equation (5) provides for delay alignment between the two branches of the error cancellation circuit without canceling undistorted signals. It is noted that a least mean square algorithm that employs a constraint as specified in equation (5) will not provide for equalization. However, unlike power amplifier 62, auxiliary amplifier 72 is designed to perform acceptably without the need for equalization because of the relatively low power of $V_d$.

It is also noted that equation (5) suggests that there are three degrees of freedom relating to variable $c_r$, $c_i$, t, that may be employed to update coefficients $\beta_i$, where $c_r$, $c_i$ are respectively the real and imaginary parts of complex variable c in equation (5). The coefficient updates as measured by a least mean square algorithm are $$p(k)=\mu_\beta V_o(kT)[V_d(kT)V_d(kT-\tau) \ldots V_d(kT-M\tau)]^* \quad (6)$$

wherein p(k) is a vector update, $\mu_\beta$ is the step size employed by the least mean square algorithm. Thus, in accordance with one embodiment of the invention in order to determine the solutions based on the constraint specified in equation (5) the least mean square coefficient updates in equation (6) are projected on the subset defined in equation (5) before updating tap coefficients $\beta_i$. The constrained solution can be expressed as $$\beta_i(k+1) = c(k+1)\mathrm{sinc}\left(i + \frac{t(k+1)}{\tau}\right) \quad (7)$$

$$= (c(k) + \Delta c(k))\mathrm{sinc}\left(i + \frac{t(k) + \Delta t(k)}{\tau}\right). \quad (8)$$

Assume $\Delta w(k)$ for a variable w is defined as $[\Delta c_r(k), \Delta c_i(k), \Delta t(k)]^T$, and is given by $$\Delta w(k) = \left(\frac{\partial N\beta(k)}{\partial w}\right)^+ [\mathrm{Re}(p^T(k))\mathrm{Im}(p^T(k))]^T, \quad (9)$$

wherein $(.)^+$ denotes the pseudo-inverse $$\beta(k)=[\mathrm{Re}\,(\beta)\;\mathrm{Im}\,(\overline{\beta})]^T \text{ and } \beta=[\beta_0(k),\beta_1(k),\ldots\beta_M(k)].$$

Thus, the matrix applying pseudo-inverse in equation (9) $[\partial\beta(k)/2w]$, is a (2M+2)×3 matrix and can be expanded as $$\begin{vmatrix} \frac{\partial\mathrm{Re}(\beta_0(k))}{\partial c_r} & \frac{\partial\mathrm{Re}(\beta_0(k))}{\partial c_i} & \frac{\partial\mathrm{Re}(\beta_0(k))}{\partial t} \\ \vdots & \vdots & \vdots \\ \frac{\partial\mathrm{Re}(\beta_M(k))}{\partial c_r} & \frac{\partial\mathrm{Re}(\beta_M(k))}{\partial c_i} & \frac{\partial\mathrm{Re}(\beta_M(k))}{\partial t} \\ \frac{\partial\mathrm{Im}(\beta_0(k))}{\partial c_r} & \frac{\partial\mathrm{Im}(\beta_0(k))}{\partial c_i} & \frac{\partial\mathrm{Im}(\beta_0(k))}{\partial t} \\ \vdots & \vdots & \vdots \\ \frac{\partial\mathrm{Im}(\beta_M(k))}{\partial c_r} & \frac{\partial\mathrm{Im}(\beta_M(k))}{\partial c_i} & \frac{\partial\mathrm{Im}(\beta_M(k))}{\partial t} \end{vmatrix} \quad (10)$$

Figure 3:
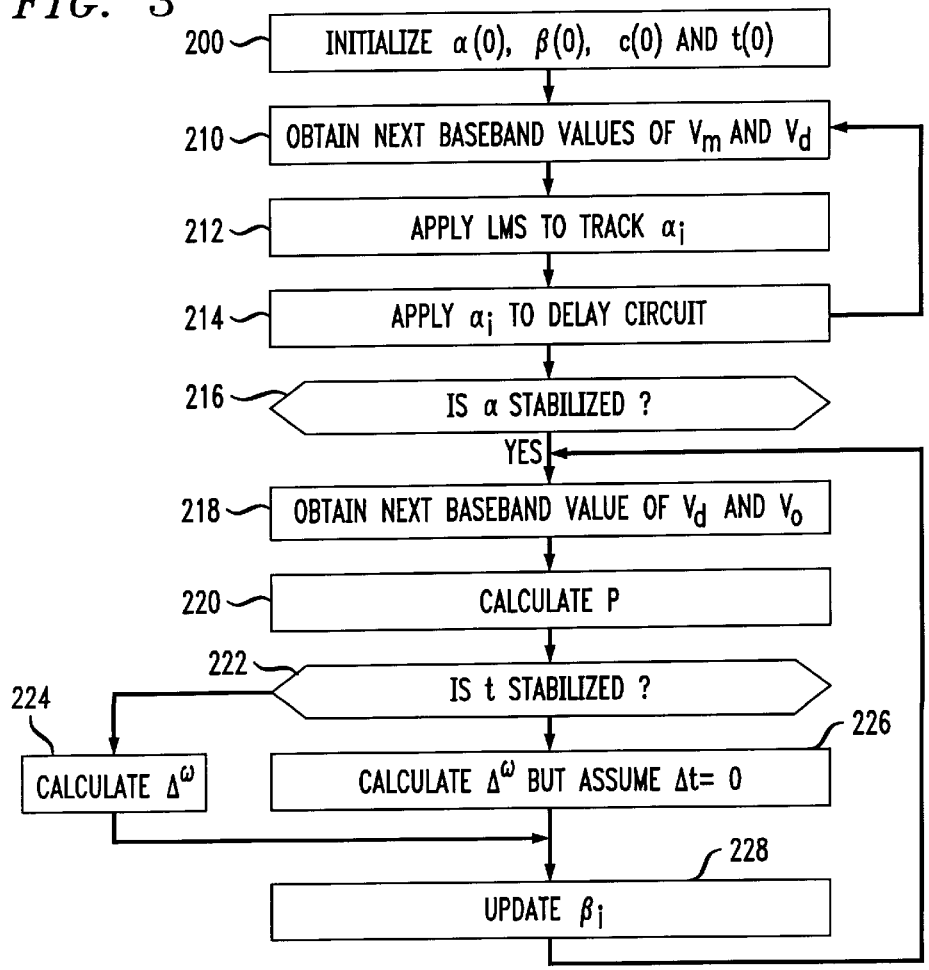
FIG. 3 illustrates a flow diagram of the steps taken by a digital signal processor employed by the feedforward linearizer illustrated in FIG. 2a in accordance with one embodiment of the present invention.
Figure 4A:
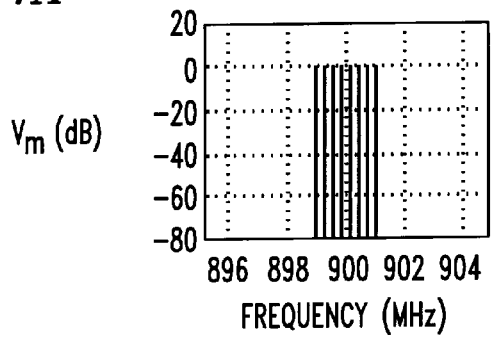
FIGS. 4a–4d illustrate the simulation results of the computations made by the signal processor in accordance with the present invention.
Figure 4B:
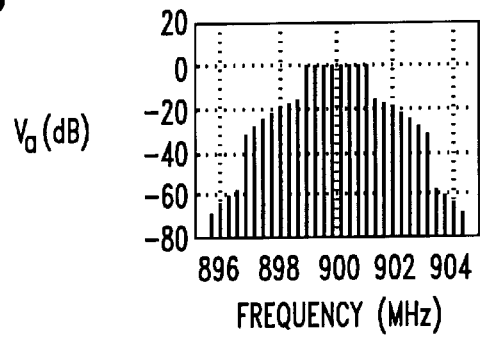
Figure 4C:
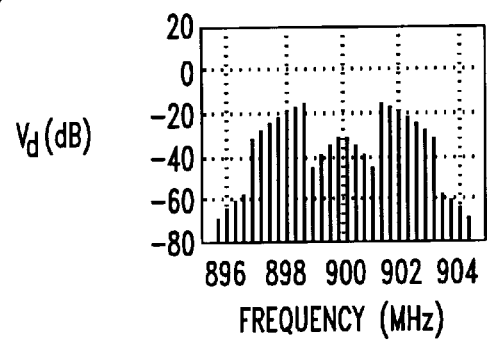
Figure 4D:
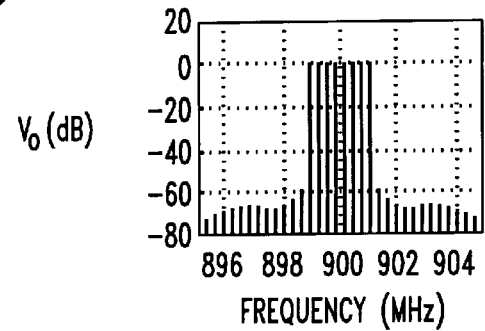

FIG. 3 illustrates a flow chart illustrating the steps accomplished by digital signal processing circuit 80 in accordance with one embodiment of the invention, although the invention is not limited in scope in that respect. At step 200, processing circuit 80 initializes the values of $\alpha_i(0)$, $\beta_i(0)$, c(0) and t(0). At step 210, processing circuit 80 obtains the next available baseband input signals $V_m$, and error signal $V_d$.

At step 212, processing circuit 80 employs a least mean square algorithm to track the tap coefficients $\alpha_i$ as explained in accordance with equation (2). At step 214, the update values of tap coefficients $\alpha_i$ are applied to delay circuit 120. The least mean square algorithm continues its estimation through an infinite loop of steps 210, 212 and 214 to track the variation of the input signal statistics and other environmental factors.

At the same time, processing circuit 80 determines at step 216 whether the value of tap coefficients $\alpha$ has been stabilized. At step 218 processing circuit 80 proceeds to obtain tap coefficients $\beta_i$ for delay circuit 134 by obtaining the next available baseband value of $V_d$ and $V_o$ respectively. At step 220 processing circuit 80 calculates the updated values p(k) in accordance with equation (6). At step 222 processing circuit determines whether the delay adjustment variable, representing the delay difference between the upper and lower branches of error cancellation circuit 88, has been stabilized. If not, digital signal processing circuit 80 goes to step 224 and calculates $\Delta w$ in equation (9). Thereafter, processing circuit 80 goes to step 228 to update $\beta$ in equation (8) and apply the updated tap coefficients to delay circuit 134. If however, at step 222, processing circuit 80 determines that parameter t has been stabilized, processing circuit 80 goes to step 226 and calculates $\Delta w$ in equation (9) with the condition that $\Delta t=0$. It is noted that the third column of matrix 10 will be set to zero leading to a simple calculation. Thereafter the processing circuit goes to step 228 as described before. Again, steps 218 through 228 form an infinite loop to track the variation of the input signal statistics and other environmental factors.

Thus, in accordance with one embodiment of the invention, processing circuit 80 provides both equalization and delay adjustment in the signal cancellation circuit and provide delay adjustment in the error cancellation circuit. As discussed in reference with simulation results illustrated in FIGS. 4 through 6, linearizer 60 provides a remarkable response.

FIGS. 4(a) through 4(d) illustrate simulation results of linearizer 60 in accordance with one embodiment of the invention as described above. For this simulation, the input signal consists of eight tones with unit amplitude which are placed 300 kHz apart one after another. The central frequency is 900 Mhz. Temperature and other environmental factors are assumed to be constant. The power amplifier model employed in the simulation contains both linear and nonlinear distortions and can be described by a polynomial, $$Va(KT) = \overline{V_m}(k) + 0.9\overline{V_m}(kT-\tau) + 0.005\overline{Vm^3}(kT) \quad (11)$$

wherein $\tau$ is set to be the reciprocal of the signal bandwidth. For both cancellation circuits, a delay misalignment of $\tau/3$ is assumed. Furthermore, each delay circuit 120 and 134 employs seven tap delay elements.

Figure 5A:
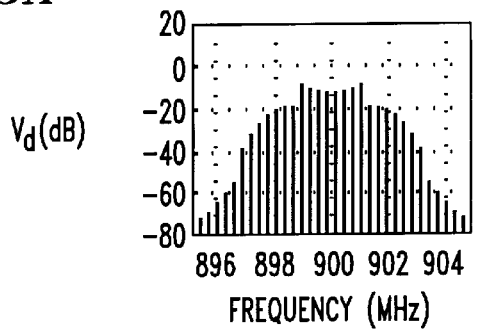
FIGS. 5a–5b illustrate the simulation results with linear distortion but with no delay mismatches.
Figure 5B:
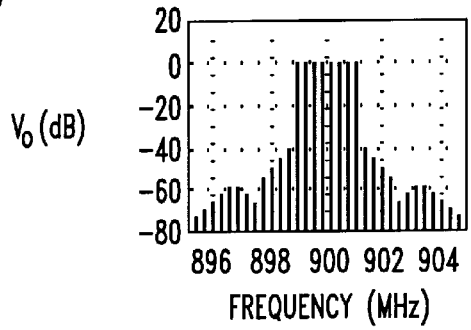
Figure 6A:
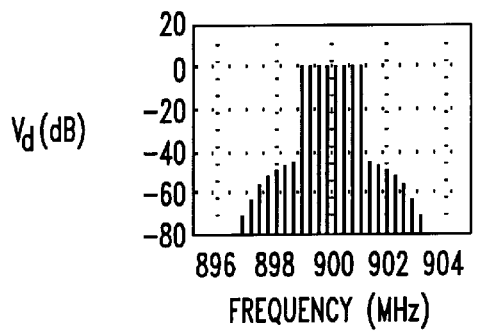
FIGS. 6a–6b illustrate the simulation results with no liner distortion but with delay mismatches.
Figure 6B:
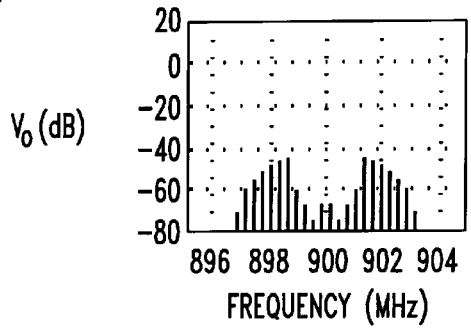

FIGS. 4(a)–4(d) illustrated the performance of the system in accordance with one embodiment of the invention. FIGS. 5(a)–5(b) illustrate the performance of an equivalent algorithm with the tap delay circuit replaced by a single-tap vector modulator, and the assumption that there are no delay mismatches between the upper and lower branches of both the cancellation circuits. FIGS. 6(a) and 6(d) illustrate the performance of an equivalent algorithm with the tap delay circuit replaced by a single-tap vector modulator and the assumption that there is no distortion but there are delay mismatches between the upper and lower branches of both the cancellation circuits.

It is noted that in accordance with the principles of the present invention, it is possible to reduce the power of the distortion signals going through the auxiliary amplifier, and correct delay misalignments.

While only certain features of the invention have been illustrated and described herein, many modifications, changes or equivalents will now occur to those skilled in the art. It is therefore, to be understood that the appended claims are intended to cover all such modifications and changes that fall within the true spirit of the invention.

We claim:

1. A feedforward linearizer for amplifying an input signal comprises:

a signal cancellation circuit having a first signal cancellation branch and a second signal cancellation branch;

a signal cancellation delay circuit within said first signal cancellation branch configured to receive said input signal, said delay circuit having a plurality of tap delay elements connected in series, wherein each of said tap delay elements provides a delayed version of said input signal, said delay circuit further comprising a plurality of tap coefficient multipliers each coupled to a corresponding tap delay element so as to receive a corresponding one of said delayed versions of said input signal and to multiply each of said delayed versions of said input signal with a corresponding tap coefficient, said delay circuit further comprising a delay circuit adder coupled to an output port of each one of said multipliers so as to add output signals provided by said multipliers;

a first amplifier provided in said first signal cancellation branch, said amplifier configured to receive an output signal of said delay circuit adder intended to be amplified;

a signal cancellation adder coupled to an output port of said first amplifier via an attenuator and to said input signal via said second signal cancellation branch so as to provide an error signal;

an error cancellation circuit having a first error cancellation branch and a second error cancellation branch;

an error cancellation delay circuit having a plurality of tap delay elements connected in series, wherein each of said tap delay elements provides a delayed version of said error signal, said delay circuit further comprising a plurality of tap coefficient multipliers each coupled to a corresponding tap delay element so as to multiply each of said delayed versions of said error signal with a tap coefficient, said delay circuit further comprising a delay circuit adder coupled to an output port of each one of said multipliers;

a second amplifier provided in said first error cancellation branch, said amplifier configured to receive an output signal provided by said delay circuit adder an error cancellation adder in said first error cancellation branch, said error cancellation adder configured to receive the output signal provided by said second amplifier;

also to receive the output signal of the signal cancellation adder;

provide the final linearization output; and a digital signal processor configured to provide said signal cancellation delay adjustment coefficients $\alpha_i$, to said tap coefficient multipliers an error signal cancellation delay adjustment coefficients, $\beta_i$, to said tap coefficient multipliers such that the delay in said upper and lower branches of said both cancellation circuits is substantially aligned, and the output signal of said first amplifier is substantially equalized.

2. The feedforward linearizer in accordance with claim 1, wherein said digital signal processor comprises a least mean square calculator that calculates said delay adjustment coefficients for said signal cancellation delay circuit by employing a least mean square algorithm.

3. The feedforward linearizer in accordance with claim 2, wherein said delay elements in said signal cancellation delay circuit provide a delay substantially equal to the reciprocal of the bandwidth of said input signal.

4. The feedforward linearizer in accordance with claim 3, further comprising an attenuator coupled to said first amplifier and configured to receive said amplified signals provided by said first amplifier and attenuate said signals so as to provide an attenuated version of said amplified signals to said signal cancellation adder.

5. The feedforward linearizer in accordance with claim 1, wherein said digital signal processor comprises a least mean square calculator that calculates said adjustment coefficient signals, $\beta_i$ for said error cancellation delay circuit by employing a constrained least mean square algorithm.

6. The feedforward linearizer in accordance with claim 5, wherein said least mean square calculator employs a constrained least mean square algorithm by projecting least mean square coefficient updates $$p(k)=\mu_\beta V_o(kT)[V_d(kT)V_d(kT-\tau) \ldots V_d(kT-M\tau)]^*$$

onto a subset of $\beta_i$ that is defined as a sinc function in the form $$\beta_i = c\operatorname{sinc}\left(i + \frac{t}{\tau}\right) \qquad i = 0, 1, \ldots, M,$$

wherein p(k) is a vector update, $\mu_\beta$ is the step size employed by the least mean square calculator, $V_o$ is a signal sample representing the output signal of said linearizer, $V_d$ is a signal sample representing said error signal, M is the number of tap delay elements in said error cancellation delay circuit, $\tau$ is a delay of each of said tap delay elements in said error cancellation delay circuit, 1/T is the sampling rate of said signals, variable t represents a delay adjustment in said error cancellation circuit and c is a complex scaling variable.

7. An integrated circuit comprising a feedforward linearizer in accordance with claim 1.

8. In a feedforward linearizer for amplifying an input signal by a power amplifier said linearizer having a signal cancellation circuit and an error cancellation circuit a signal cancellation delay circuit in said signal cancellation circuit comprises:

a plurality of tap delay elements coupled to said input signal and connected in series such that each of said tap delay elements provides a delayed version of said input signal;

a plurality of tap coefficient multipliers each coupled to a corresponding tap delay element so as to receive a corresponding one of said delayed versions of said input signal and to multiply each of said delayed versions of said input signal with a corresponding tap coefficient;

a delay circuit adder coupled to an output port of each one of said multipliers so as to add output signals provided by each one of said multipliers and to provide a summed signal to said power amplifier.

9. The signal cancellation delay circuit in accordance with claim 8 wherein the delay of said tap delay elements is inversely proportional to the bandwidth of said input signal.

10. The signal cancellation delay circuit in accordance with claim 8 wherein said signal cancellation loop comprise an upper branch for carrying said input signal through said delay circuit and said power amplifier to a signal cancellation adder and a lower branch for carrying said input signal to said signal cancellation adder, said input signal arriving at said signal cancellation adder within a delay period, defined as a delay misalignment.

11. The signal cancellation delay circuit in accordance with claim 10 wherein said tap coefficients are generated by a digital signal processor.

12. The signal cancellation delay circuit in accordance with claim 11, wherein said digital signal processor calculates said tap coefficients in accordance with a least square algorithm.

13. In a feedforward linearizer for amplifying an input signal by a power amplifier said linearizer having a signal cancellation circuit that generates an error signal and an error cancellation circuit having an auxiliary amplifier responsive to said error signal, an error cancellation delay circuit in said error cancellation circuit comprises:
- a plurality of tap delay elements coupled to said error signal and connected in series such that each of said tap delay elements provides a delayed version of said error signal;
- a plurality of tap coefficient multipliers each coupled to a corresponding tap delay element so as to multiply each of said delayed versions of said error signal with a tap coefficient;
- a delay circuit adder coupled to an output port of each one of said multipliers so as to provide a summed signal to said auxiliary amplifier.

14. The error cancellation delay circuit in accordance with claim 13 wherein said error cancellation circuit comprise a lower branch for carrying said error signal through said delay circuit and said auxiliary amplifier to an error cancellation adder and an upper branch for carrying an output signal of said power amplifier to said error cancellation adder, said signals arriving at said error cancellation adder within a delay period, defined as a delay misalignment.

15. The error cancellation delay circuit in accordance with claim 14 wherein said tap coefficients are generated by a digital signal processor.

16. The error cancellation delay circuit in accordance with claim 15, wherein said digital signal processor calculates said tap coefficients $\beta_i$ in accordance with a constrained least square algorithm such that least mean square coefficient updates $$p(k)=\mu_\beta V_o(kT)[V_d(kT)V_d(kT-\tau) \ldots V_d(kT-M\tau)]^*$$

are projected onto a subset of $\beta_i$ that is defined as a sinc function in the form $$\beta_i = c\mathrm{sinc}\left(i+\frac{t}{\tau}\right) \qquad i = 0, 1, \ldots, M,$$

wherein p(k) is a vector update, $\mu_\beta$ is the step size employed by the least mean square calculator, $V_o$ is a signal sample representing the output signal of said linearizer, $V_d$ is a signal sample representing said error signal, M is the number of tap delay elements in said error cancellation delay circuit, $\tau$ is a delay of each of said tap delay elements in said error cancellation delay circuit, 1/T is the sampling rate of said signals, variable t represents a delay adjustment in said error cancellation circuit and c is a complex variable.

17. In a feedforward linearizer for amplifying an input signal by a power amplifier said linearizer having a signal cancellation circuit that generates an error signal and an error cancellation circuit having an auxiliary amplifier responsive to said error signal, a method to linearize said amplifier comprising the steps of:
- providing a plurality of delayed versions of said input signal;
- multiplying each of said delayed versions of said input signal by a corresponding signal cancellation tap coefficient;
- adding the signals generated from said multiplication step so as to provide a summed signal to said power amplifier.

18. The method in accordance with claim 17 wherein said step of providing a plurality of delayed version of said input signal further comprises the steps of delaying said input signal by a delay that is inversely proportional to the bandwidth of said input signal.

19. The method in accordance with claim 18 further comprising the step of carrying said input signal through an upper branch to a signal cancellation adder and carrying said input signal through a lower branch to said signal cancellation adder, said input signal arriving at said signal cancellation adder within a delay period, defined as a delay misalignment.

20. The method in accordance with claim 19 further comprising the steps of generating said tap coefficients by a digital signal processor.

21. The method in accordance with claim 19 further comprising the steps of calculating said tap coefficients in accordance with a least square algorithm.

22. The method in accordance with claim 17 further comprising:
- providing a plurality of delayed versions of said error signal;
- multiplying each of said delayed versions of said error signal with a tap coefficient; and
- adding said multiplied error signals so as to provide a summed signal to said auxiliary amplifier.

23. The method in accordance with claim 22 further comprising the steps of carrying said error signal to an error cancellation adder through a lower branch of said error cancellation circuit and carrying an output signal of said power amplifier to said error cancellation adder, through an upper branch of said error cancellation circuit said signals arriving at said error cancellation adder within a delay period, defined as a delay misalignment.

24. The method in accordance with claim 23 further comprising the step of calculating said tap coefficients $\beta_i$ in accordance with a constrained least square algorithm such that least mean square coefficient updates $$p(k)=\mu_\beta V_o(kT)[V_d(kT)V_d(kT-\tau) \ldots V_d(kT-M\tau)]^*$$

are projected onto a subset of $\beta_i$ that is defined as a sinc function in the form $$\beta_i = c\mathrm{sinc}\left(i+\frac{t}{\tau}\right) \qquad i = 0, 1, \ldots, M,$$

wherein p(k) is a vector update, $\mu_\beta$ is the step size employed by the least mean square calculator, $V_o$ is a signal sample representing the output signal of said linearizer, $V_d$ is a signal sample representing said error signal, M is the number of tap delay elements in said error cancellation delay circuit, $\tau$ is a delay of each of said tap delay elements in said error cancellation delay circuit, 1/T is the sampling rate of said signals, variable t represents a delay adjustment in said error cancellation circuit and c is a complex variable.

* * * * *